US008390070B2

(12) United States Patent
Chen

(10) Patent No.: US 8,390,070 B2
(45) Date of Patent: Mar. 5, 2013

(54) ELECTROSTATIC DISCHARGE PROTECTION DEVICE AND ELECTROSTATIC DISCHARGE PROTECTION CIRCUIT THEREOF

(75) Inventor: Wei-Fan Chen, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 6 days.

(21) Appl. No.: 13/080,662

(22) Filed: Apr. 6, 2011

(65) Prior Publication Data

US 2012/0256229 A1 Oct. 11, 2012

(51) Int. Cl.
*H01L 29/786* (2006.01)

(52) U.S. Cl. ......................... 257/360; 257/141; 257/162

(58) Field of Classification Search .................. 257/360, 257/141, 162, 173, 350; 361/56, 100
See application file for complete search history.

(56) References Cited

U.S. PATENT DOCUMENTS

| | | | | |
|---|---|---|---|---|
| 6,765,771 | B2 * | 7/2004 | Ker et al. | 361/56 |
| 6,906,387 | B1 * | 6/2005 | Reese et al. | 257/355 |

* cited by examiner

*Primary Examiner* — Howard Weiss
*Assistant Examiner* — Steven Rao
(74) *Attorney, Agent, or Firm* — Winston Hsu; Scott Margo

(57) ABSTRACT

The ESD protection device includes a substrate, a well, a first doped region and a second doped region. The substrate has a first conductive type, and the substrate is electrically connected to a first power node. The well has a second conductive type, and is disposed in the substrate. The first doped region has the first conductive type, and is disposed in the well. The first doped region and the well are electrically connected to a second power node. The second doped region has the second conductive type, and is disposed in the substrate. The second doped region is in a floating state.

12 Claims, 10 Drawing Sheets

100
104
102
114
118
110
112
116
108
106

ELECTROSTATIC DISCHARGE PROTECTION DEVICE AND ELECTROSTATIC DISCHARGE PROTECTION CIRCUIT THEREOF

BACKGROUND OF THE INVENTION

1. Field of the Invention

The present invention relates to an ESD protection device and a circuit thereof, and more particularly, to an ESD protection device with a silicon-controlled rectifier (SCR) and circuit thereof.

2. Description of the Prior Art

Electrostatic discharge (ESD) represents one of the main threats to reliability in semiconductor products, especially in scaled-down CMOS technologies. Due to low breakdown voltage of thinner gate oxide in deep-submicron CMOS technologies, an efficient ESD protection circuit must be designed and placed on every input pad to clamp the overstress voltage across the gate oxide of the internal circuit. The ESD robustness of the ESD protection circuit is generally needed to be higher than 2 kV in the human-body-model (HBM) ESD stress. While withstanding ESD overstress, it is desired that the ESD protection circuit have relatively small dimensional requirements to save silicon area.

A silicon-controlled rectifier (SCR) is demonstrated to be suitable for ESD protection design, because it has both high ESD robustness and low parasitic capacitance under a small layout area. Refer to FIG. 1 and FIG. 2. FIG. 1 is a schematic diagram illustrating a cross-sectional view of a SCR device according to the prior art, and FIG. 2 is a schematic diagram illustrating the current-voltage characteristics of the SCR device according to the prior art. As shown in FIG. 1, the SCR device 10 of the prior art includes a P-type substrate 12, a N-type well 14 disposed in the P-type substrate 12, a first N-type doped region 16 and a first P-type doped region 18 disposed in the N-type well 14, and a second N-type doped region 20 and a second P-type doped region 22 disposed in the P-type substrate 12. When the SCR device 10 is used as a power-rail ESD clamp circuit electrically connected between a high power node 24 and a low power node 26, the first N-type doped region 16 and the first P-type doped region 18 are electrically connected to the high power node 24, and the second N-type doped region 20 and the second P-type doped region 22 are electrically connected to the low power node 26. The SCR device 10 can provides a discharging path to discharging the ESD current zapped from the high power node 24 or the low power node 26, and the discharging path is constituted by the first P-type doped region 18, the N-type well 14, the P-type substrate 12 and the second N-type doped region 20. When an ESD event occurs, the ESD current can be discharged through the discharging path, so that an internal circuit connected between the high power node 24 and the low power node 26 can be protected.

As shown in FIG. 2, the SCR device 10 of the prior art has a trigger voltage $V_t$ and a holding voltage $V_h$. The trigger voltage $V_t$ of the SCR device 10 is approximately equal to the breakdown voltage of the P-N junction between the N-type well 14 and the p-type substrate 12, about 30-40 volts, and the holding voltage $V_h$ of the SCR device 10 is about 1.2 volts. During the ESD event, the ESD zapping voltage is larger than a trigger voltage $V_t$ of the SCR device 10, so that the discharging path is turned on, and the SCR device 10 is in a latch-up state. During a normal operation, the high power node 24 is generally provided with 3.3 volts, and the low power node 26 is grounded, so that the voltage difference between the high power node 24 and the low power node 26 is smaller than the trigger voltage $V_t$ of the SCR device 10. The SCR device 10 is in an off state.

However, noise generated from the internal circuits is often coupled into the P-type substrate 12, and the SCR device 10 is easily triggered into the latch-up state by the noise or leakage current. When the SCR device 10 is triggered on during the normal operation, the actual signals provided to the internal circuit will not be detected correctly, and even the internal circuit is burnt out by the current passing through SCR device 10.

In order to effectively protect the internal circuit, some designs to increase the holding voltage of the power-rail ESD clamp circuit are provided. Because a diode in the forward-biased condition can sustain a much higher ESD level than it can in the reverse-biased condition, one of the designs provides a diode string to be stacked in series from the first P-type doped region to the P-type substrate to increasing the holding voltage of the SCR device. However, the diode string has a plurality of diodes, respectively disposed in an N-type well. For this reason, each diode, each N-type well and the P-type substrate constitute a PNP bipolar junction transistor (BJT), and the PNP BJTs have common collectors being electrically connected between the high power node and the lower power node. Furthermore, a junction leakage current generated in the P-N junction of the PNP BJT will be amplified by the Darlington pair formed by the PNP BJTs. Therefore, the PNP BJTs still generates large leakage current, and the leakage current may degrade or burn out the internal circuit.

SUMMARY OF THE INVENTION

It is therefore an objective to provide an electrostatic discharge (ESD) protection device and an ESD protection circuit thereof to overcome the above-mentioned issue.

According to a preferred embodiment, an ESD protection device is provided. The ESD protection device includes a substrate, a well, a first doped region and a second doped region. The substrate has a first conductive type, and the substrate is electrically connected to a first power node. The well has a second conductive type, and is disposed in the substrate. The first doped region has the first conductive type, and is disposed in the well. The first doped region and the well are electrically connected to a second power node. The second doped region has the second conductive type, and is disposed in the substrate. The second doped region is in a floating state.

According to a preferred embodiment, an ESD protection circuit is provided. The ESD protection circuit includes a first bipolar junction transistor (BJT), a second BJT and a diode. The first BJT has a first type, and has a first base, a first emitter and a first collector, wherein the first emitter is electrically connected to the first power node. The second BJT has a second type different from the first type, and has a second base, a second emitter and a second collector, wherein the second collector is electrically connected to the first base, and the second base is electrically connected to the first collector. The diode has an anode and a cathode, wherein the anode is electrically connected to the second emitter, and the cathode is electrically connected to the first power node.

The present invention provides the ESD protection device having the N-type second doped region without being in contact with any conductive layer thereon to increase the holding voltage of the ESD protection device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
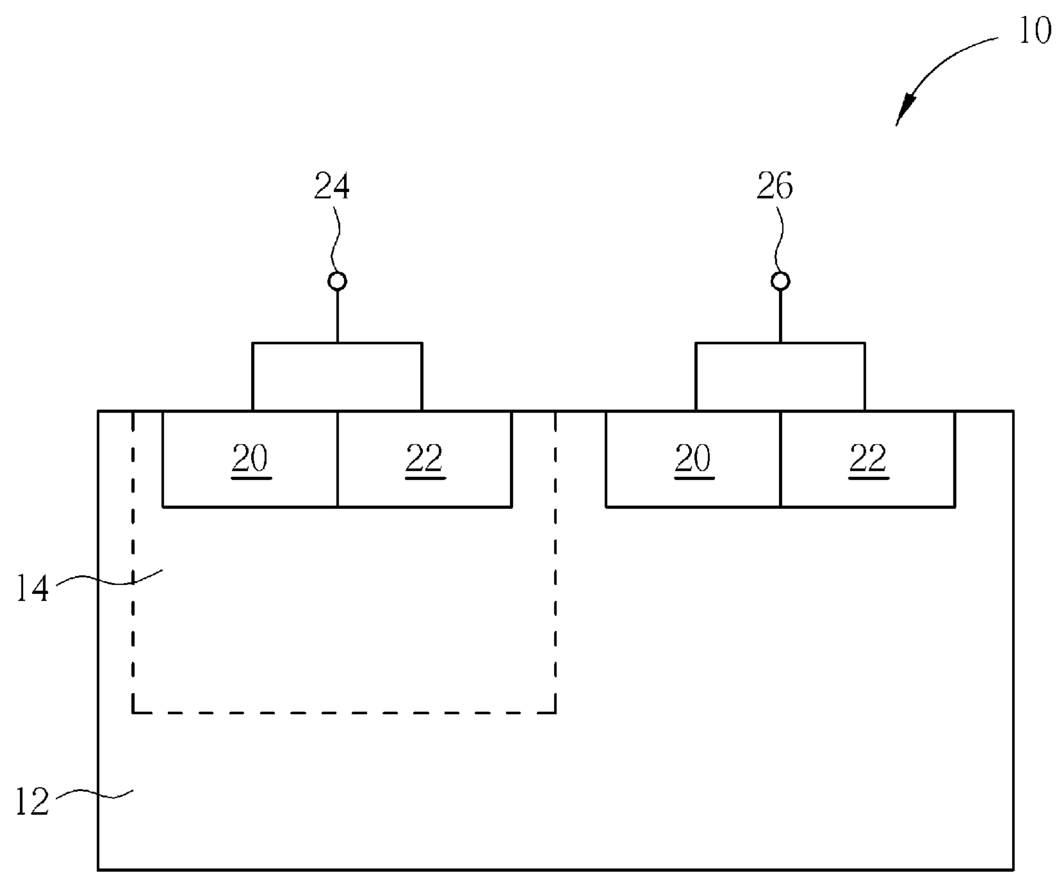
FIG. 1 is a schematic diagram illustrating a cross-sectional view of a SCR device according to the prior art.
Figure 2:
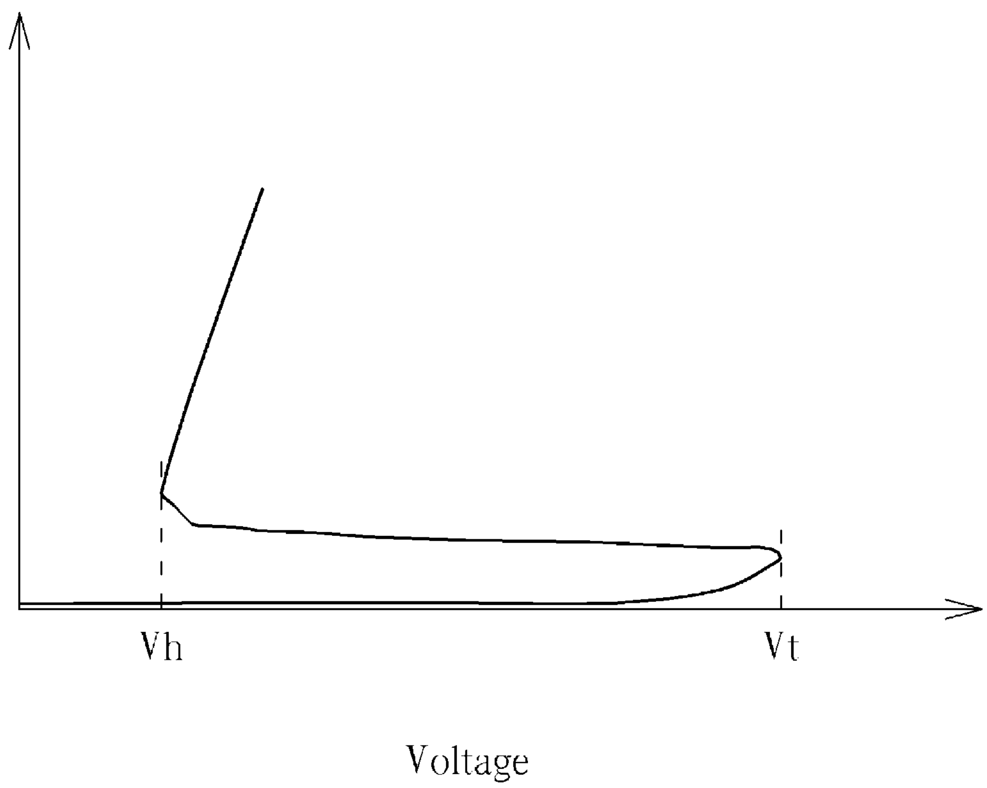
FIG. 2 is a schematic diagram illustrating the current-voltage characteristics of the SCR device according to the prior art.
Figure 3:
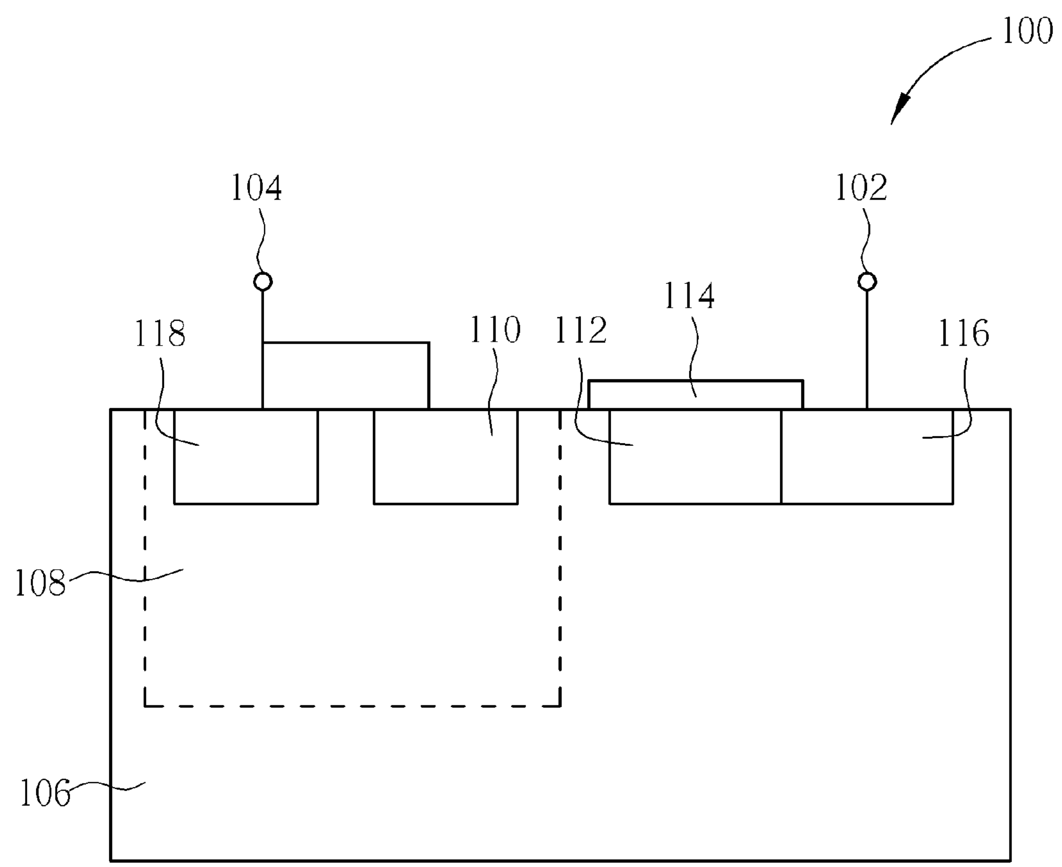
FIG. 3 is a schematic diagram illustrating a cross-sectional view of an electrostatic discharge (ESD) protection device according to a first preferred embodiment of the present invention.

Refer to FIG. 3, which is a schematic diagram illustrating a cross-sectional view of an electrostatic discharge (ESD) protection device according to a first preferred embodiment of the present invention. As shown in FIG. 3, the ESD protection device 100 is electrically connected between a first power node 102 and a second power node 104. The first power node 102 can be a low voltage node of a voltage source, and the second power node 104 can be a high voltage node of the voltage source. The ESD protection device 100 includes a substrate 106, a well 108, a first doped region 110, and a second doped region 112. The substrate 106 and the first doped region 110 have a first conductive type, and the well 108 and the second doped region 112 have a second conductive type. In this embodiment, the first conductive type is P-type, and the second conductive type is N-type. The present invention is not limited to this, and the first conductive type and the second conductive type of the present invention can be interchanged. The N-type well 108 and the N-type second doped region 112 are disposed in the P-type substrate 106, and the P-type first doped region 110 is disposed in the N-type well 110, so that the P-type first doped region 110, the N-type well 108, the P-type substrate 106 and the N-type second doped region 112 constitute a PNPN structure, which is also called silicon-controlled rectifier (SCR). In this embodiment, the P-type substrate 106 is electrically connected to the first power node 102, and the P-type first doped region 110 and the N-type well 108 are electrically connected to the second power node 104. It should be noted that the N-type second doped region 112 is in a floating state, i.e. a top surface of the N-type second doped region 112 is not in contact with any conductive layer thereon. For this reason, the ESD protection device 100 of this embodiment is a pseudo SCR (PSCR) with a SCR structure.

In addition, the ESD protection device 100 further includes an insulating layer 114, disposed on the P-type substrate 106, and the insulating layer 114 completely covers the N-type second doped region 112 in order to insulate the conductive layer disposed on the P-type substrate 106 from the N-type second doped region 112. Furthermore, because the P-type substrate 106 is electrically connected to the first power node 102, and the N-type second doped region 112 is disposed in the P-type substrate 106, the N-type second doped region 112 is electrically coupled to the first power node 102 only through the P-type substrate 106.

In this embodiment, the ESD protection device further includes a third doped region 116 and a fourth doped region 118. The third doped region 116 has P-type, and the P-type third doped region 116 is disposed in the P-type substrate 106 at the other side of the N-type second doped region 112 relative to the N-type well 108, i.e. the N-type second doped region 112 is disposed between the P-type first doped region 110 and the P-type third doped region 116. Moreover, the P-type third doped region 116 is electrically connected to the first power node 102, and the P-type third doped region 116 and the P-type substrate 106 have the same conductive type, so that the P-type substrate 106 can be electrically connected to the first power node 102 through the P-type third doped region 116.

The fourth doped region 118 has N-type, and the N-type fourth doped region 118 is disposed in the N-type well 108 at the other side of the P-type first doped region 110 relative to the N-type second doped region 112, i.e. the P-type first doped region 110 is disposed between the N-type second doped region 112 and the N-type fourth doped region 118. Moreover, the N-type fourth doped region 118 is electrically connected to the second power node 104, and the N-type fourth doped region 118 and the N-type well 108 have the same conductive type, so that the N-type well 108 can be electrically connected to the second power node 104 through the N-type fourth doped region 118.

When an ESD event occurs from the second power node 104, the ESD voltage is much larger than a junction barrier between the N-type well 108 and the P-type substrate 106. Meanwhile, an electron carrier concentration in the P-type first doped region 110 and N-type well 108 is much larger than an intrinsic charge carrier concentration, and a hole carrier concentration in the P-type substrate 106 is much larger than the intrinsic charge carrier concentration. For this reason, a high level injection is generated in the ESD protection device 100, and a depletion region between the N-type well 108 and the P-type substrate 106 is increased. The electric field of the depletion region helps in speeding up of the transport of the charge carriers from N-type well 108 to the P-type substrate 106. Because the N-type second doped region 112 is floating, a discharging path cannot be constituted by the PNPN structure, and the discharging path of this embodiment is formed by the P-type first doped region 110, the N-type well 108, the P-type substrate 106 and the P-type third doped region 116. The ESD current should be discharged through the P-type substrate 106 between the N-type well 108 and the P-type third doped region 116, so that a holding voltage of the ESD protection device 100 is increased as compared with the SCR device of the prior art.

Figure 4:
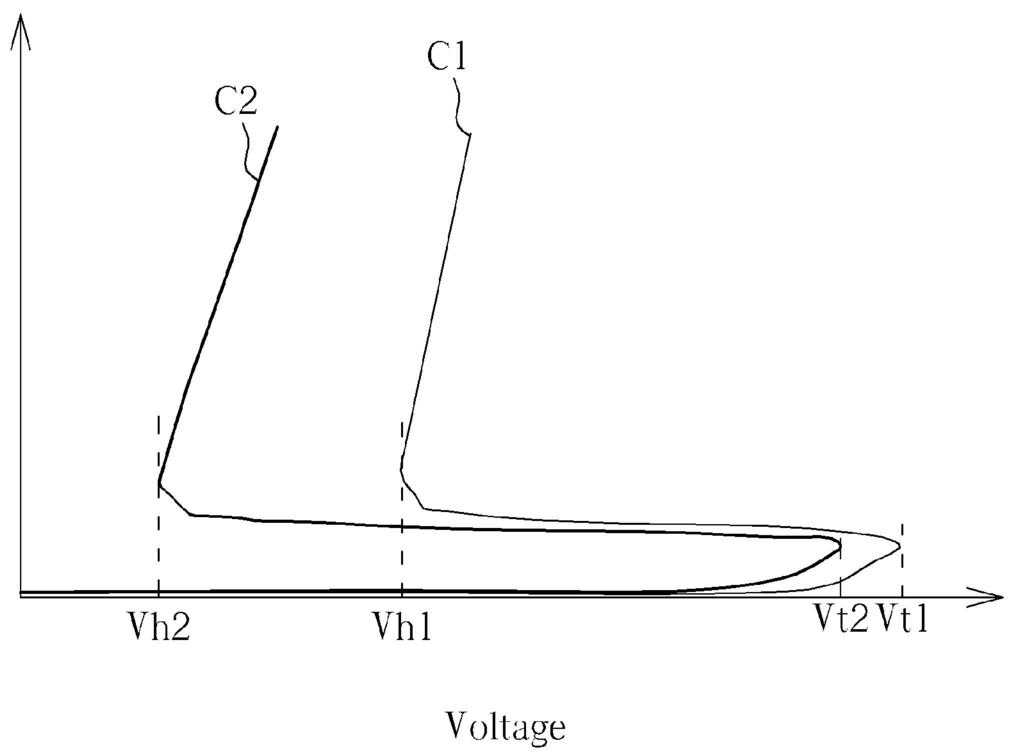
FIG. 4 is a schematic diagram illustrating the current-voltage characteristics of the ESD protection device according to the first preferred embodiment of the present invention and the SCR device according to the prior art.

Refer to FIG. 4, which is a schematic diagram illustrating the current-voltage characteristics of the ESD protection device according to the first preferred embodiment of the present invention and the SCR device according to the prior art. As shown in FIG. 4, a first curve $C_1$ represents the current-voltage characteristics of the ESD protection device 100 of the first embodiment, and a second curve $C_2$ represents the current-voltage characteristics of the SCR device of the prior art. It should be noted that the holding voltage $V_{h1}$ of the ESD protection device 100 with the floating N-type second doped region 112 is larger than the holding voltage $V_{h2}$ of the SCR device with the N-type second doped region being electrically connected to the first power node, and the holding voltage $V_{h1}$ of the ESD protection device 100 can be adjusted to be larger than the voltage of the first power node 102. Also, the trigger voltage $V_{t1}$ of the ESD protection device 100 is almost the same as the trigger voltage $V_{t2}$ of the SCR device of the prior art. Hence, when the ESD protection device 100 is triggered into the latch-up state by the noise leakage current during the normal operation, the holding voltage $V_{h1}$ of the ESD protection device 100 can be high enough to avoid being turned on, and the internal circuit can be protected.

Figure 5:
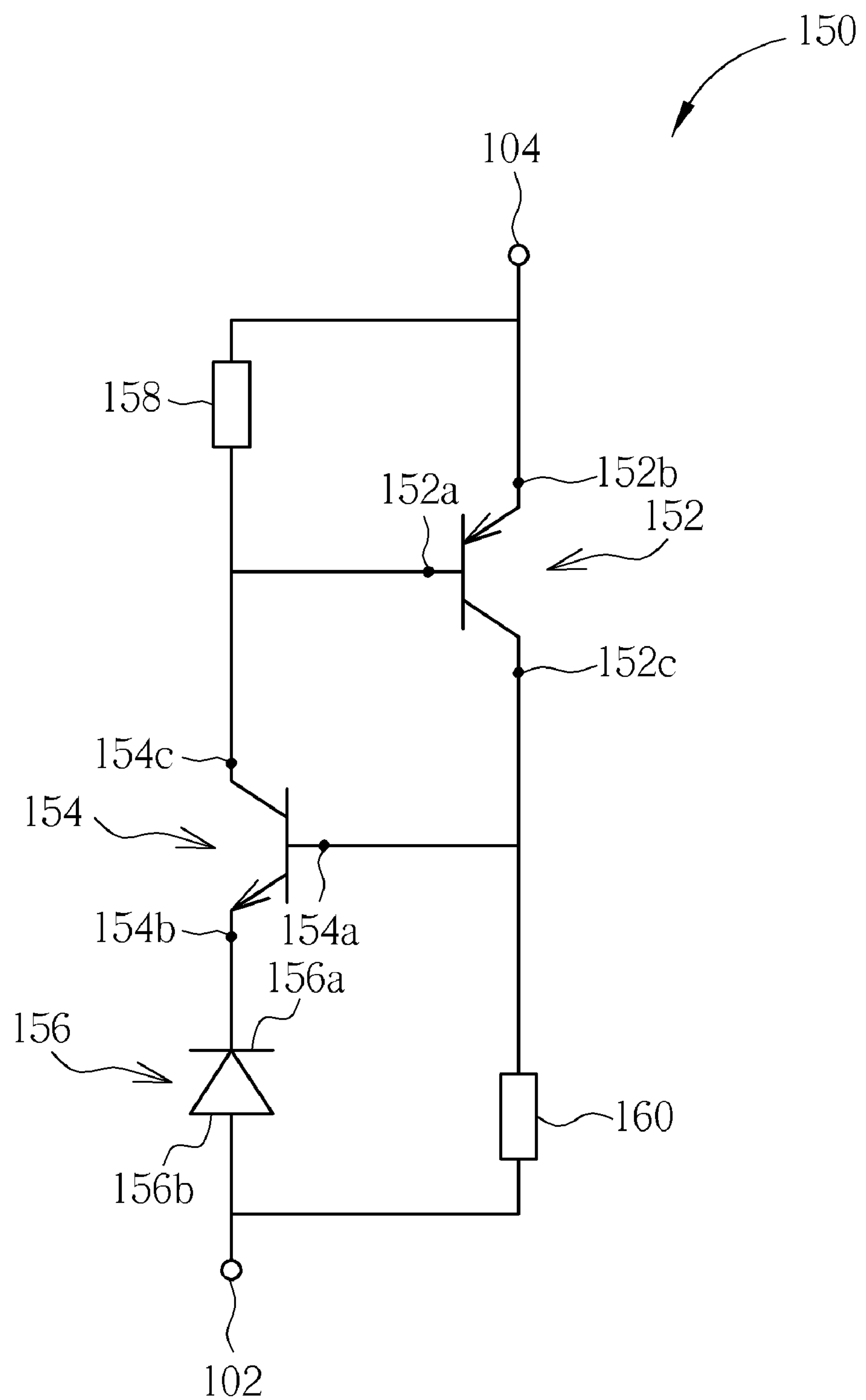
FIG. 5 is a circuit diagram of the ESD protection circuit according to the first preferred embodiment of the present invention.

According to the above-mentioned ESD protection device, the ESD protection device of the present invention can represent an ESD protection circuit for protecting an internal circuit. Refer to FIG. 5, and refer to FIG. 3 together. FIG. 5 is a circuit diagram of the ESD protection circuit according to the first preferred embodiment of the present invention. As shown in FIG. 3 and FIG. 5, the ESD protection circuit 150 includes a first bipolar junction transistor (BJT) 152, a second BJT 154, and a diode 156. The first BJT 152 has a first type, and the second BJT 154 has a second type different from the first type. The first BJT 152 has a first base 152*a*, a first emitter 152*b* and a first collector 152*c*. The first emitter 152*b* can be represented by the P-type first doped region 110, and is electrically connected to the second power node 104. The first base 152*a* is represented by the N-type well 108, and the first collector 152*c* is represented by the P-type substrate 106. In addition, the second BJT 154 has a second base 154*a*, a second emitter 154*b* and a second collector 154*c*, and the diode 156 has an anode 156*a* and a cathode 156*b*. The second collector 154*c* is represented by the N-type well 108, so that the second collector 154*c* is electrically connected to the first base 152*a*. The second base 154*a* is represented by the P-type substrate 106, so that the second base 154*a* is electrically connected to the first collector 152*c*. The second emitter 154*b* is represented by the N-type second doped region 112, and the diode 156 is formed by the N-type second doped region 112, the P-type substrate 106 between the N-type second doped region 112 and the P-type third doped region 116 and the P-type third doped region 116. Thus, the anode 156*a* is electrically connected to the second emitter 154*b*, and the cathode 156*b* is electrically connected to the first power node 102. As we can see from the above-mentioned, the first type is PNP type, and the second type is NPN type. The present invention is not limited to this, and the first type and the second type of the present invention can be interchanged.

Furthermore, the ESD protection circuit 150 further includes a first resistor 158 and a second resistor 160. The first resistor 158 is represented by the N-type well 108 disposed between the P-type substrate 106 and the N-type fourth doped region 118, so that the first resistor 158 is electrically connected between the first base 152*a* and the second power node 104. The second resistor 160 is represented by the P-type substrate 106 disposed between the N-type well 108 and the P-type third doped region 116, so that the second resistor 160 is electrically connected between the second base 154*a* and the first power node 102.

The ESD protection device of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 6:
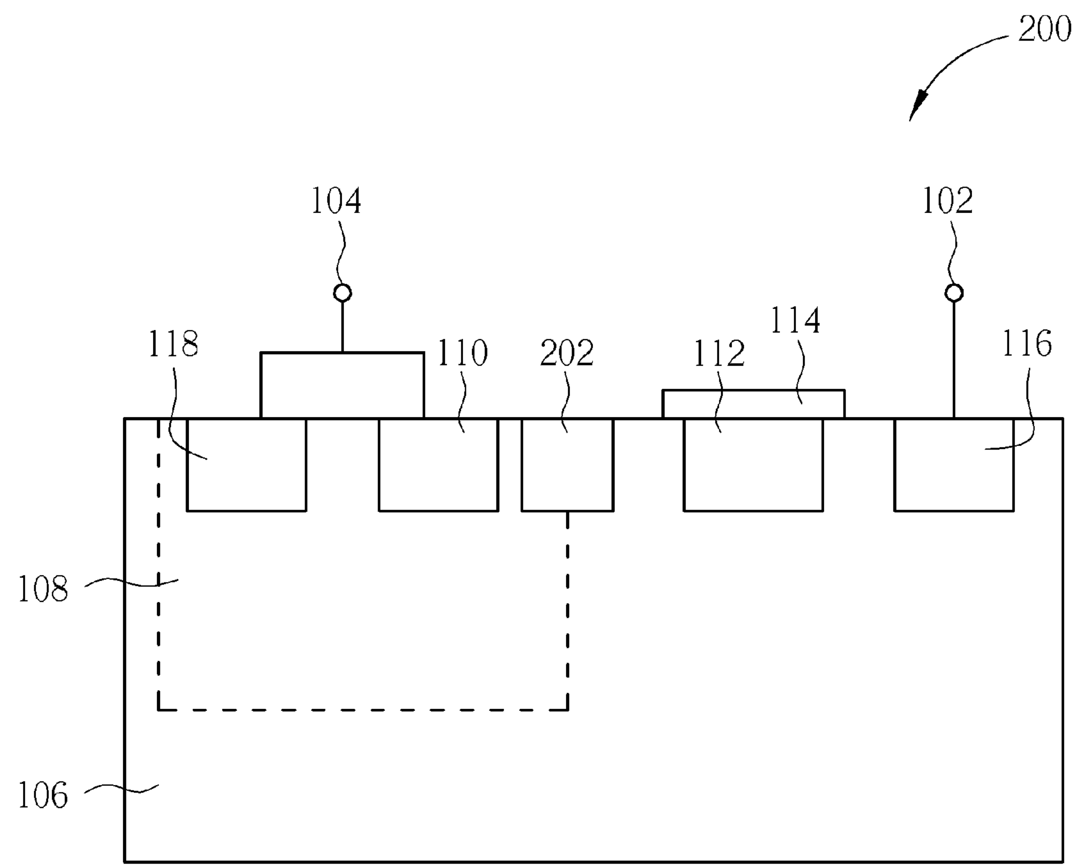
FIG. 6 is a schematic diagram illustrating a cross-sectional view of an ESD protection device according to a second preferred embodiment of the present invention.

Refer to FIG. 6, which is a schematic diagram illustrating a cross-sectional view of an ESD protection device according to a second preferred embodiment of the present invention. As shown in FIG. 6, as compared with the first preferred embodiment, the ESD protection device 200 of this embodiment further includes a fifth doped region 202 disposed across a junction between the P-type substrate 106 and the N-type well 108, and the fifth doped region 202 of this embodiment has N-type, but the present invention is not limited to this. Since the N-type fifth doped region 202 has a much higher doping concentration than the N-type well 108, the breakdown voltage across the junction between the N-type well 108 and the P-type substrate 106 is lowered, which cause the trigger voltage of the ESD protection device 200 to be much lower than that of the SCR device of prior art, and the ESD protection device 200 of this embodiment can be regarded as a pseudo modified lateral SCR (PMLSCR).

Figure 7:
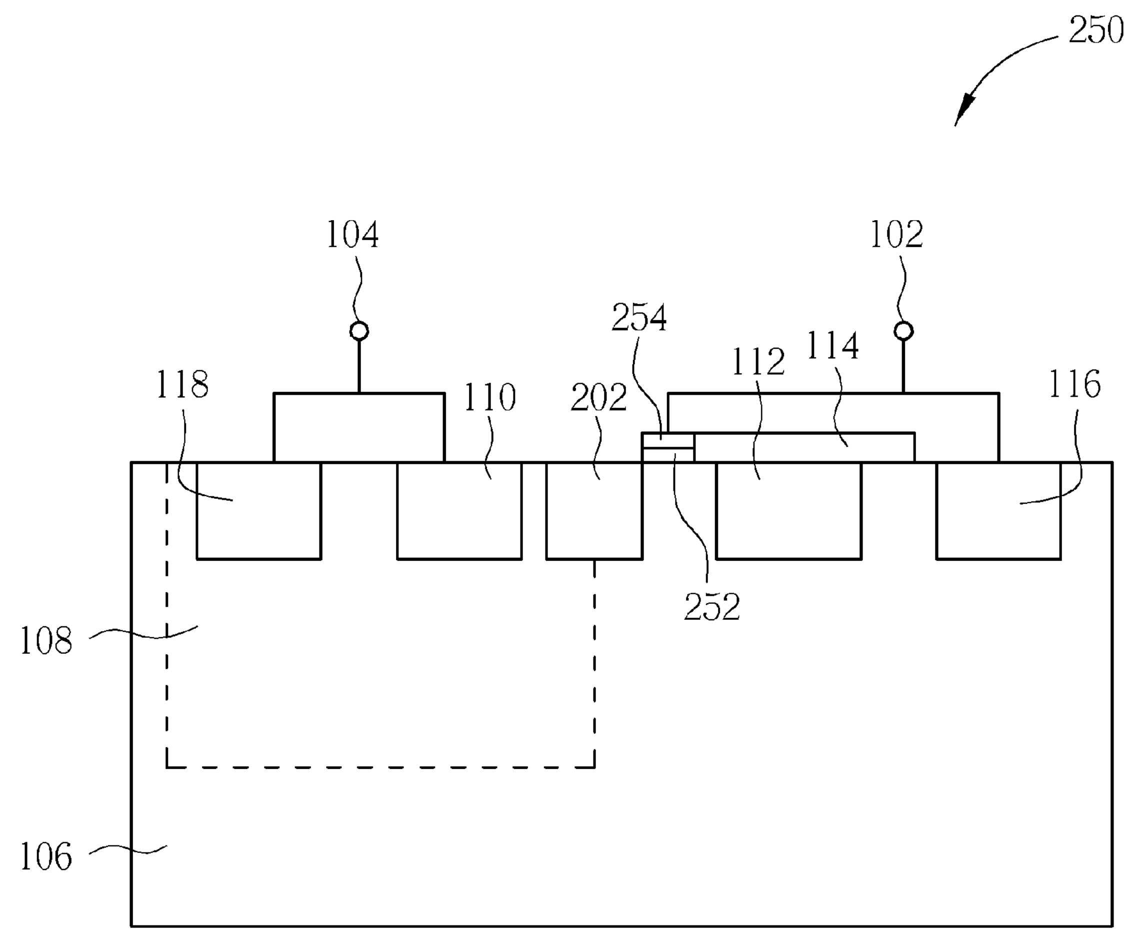
FIG. 7 is a schematic diagram illustrating a cross-sectional view of an ESD protection device according to a third preferred embodiment of the present invention.

Refer to FIG. 7, which is a schematic diagram illustrating a cross-sectional view of an ESD protection device according to a third preferred embodiment of the present invention. As shown in FIG. 7, as compared with the second preferred embodiment, the ESD protection device 250 of this embodiment further includes a gate insulating layer 252 and a control gate 254. The gate insulating layer 252 and the control gate 254 are disposed on the P-type substrate 106 between the N-type fifth doped region 202 and the N-type second doped region 112 in order to form a short channel between the N-type fifth doped region 202 and the N-type second doped region 112. Thus, a trigger voltage of the ESD protection device 250 of this embodiment is very low, and it can provide effective ESD protection for the input stages or the output buffers of CMOS ICs, without the need for a secondary protection circuit. Furthermore, the control gate 254 is disposed on the gate insulating layer 252, and is electrically connected to the first power node 102. The ESD protection device 250 of this embodiment can be regarded as a pseudo low-voltage-trigger SCR (PLVTSCR).

Figure 8:
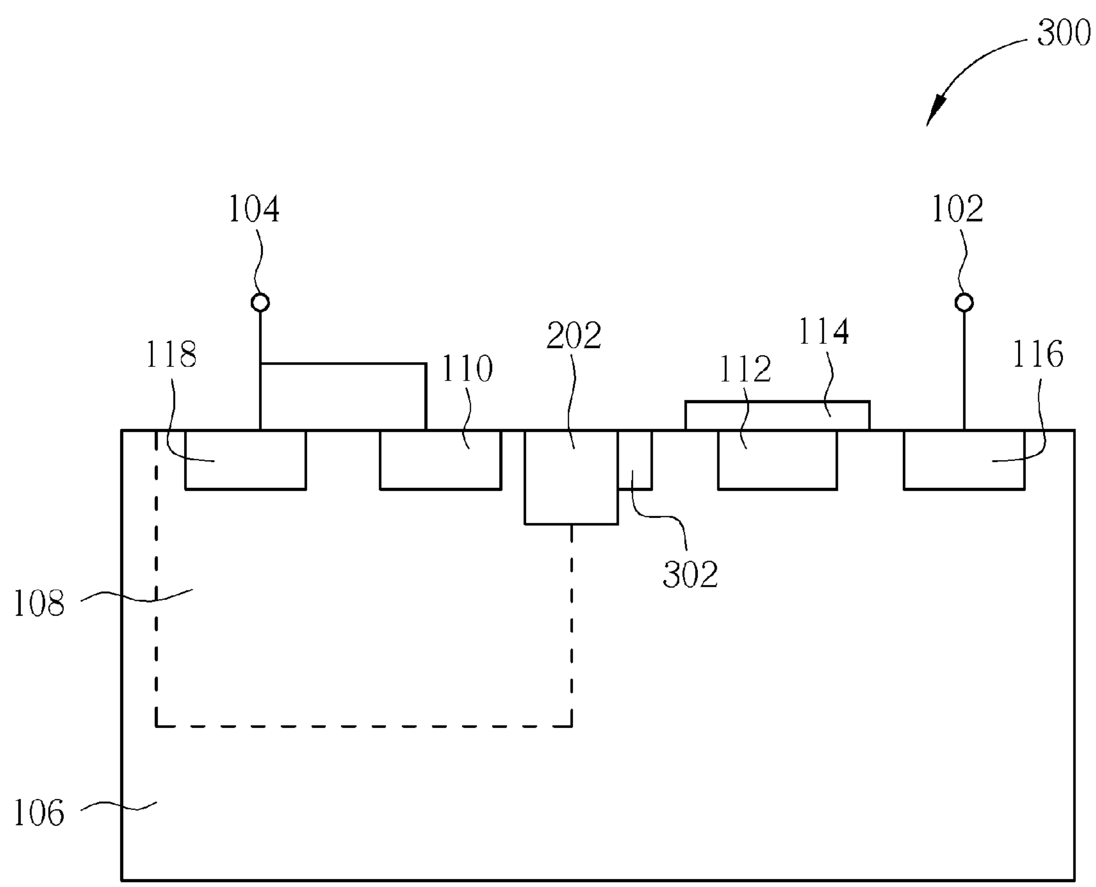
FIG. 8 is a schematic diagram illustrating a cross-sectional view of an ESD protection device according to a fourth preferred embodiment of the present invention.

Refer to FIG. 8, which is a schematic diagram illustrating a cross-sectional view of an ESD protection device according to a fourth preferred embodiment of the present invention. As shown in FIG. 8, as compared with the second preferred embodiment, the ESD protection device 300 of this embodiment further includes a sixth doped region 302. In this embodiment, the fifth doped region 202 has N-type, and the sixth doped region 302 has P-type. The P-type sixth doped region 302 is disposed in the P-type substrate 106, and is in contact with the N-type fifth doped region 202, so that the N-type fifth doped region 202 and the P-type sixth doped region 302 form a diode. The sixth doped region 302 of the present invention also can be disposed in the N-type well 108 and in contact with the N-type fifth doped region 202, and the conductive types of the sixth doped region 302 and the fifth doped region 202 can be interchanged. The ESD protection device 300 of this embodiment can be regarded as a pseudo Zener-trigger SCR (PZTSCR).

Figure 9:
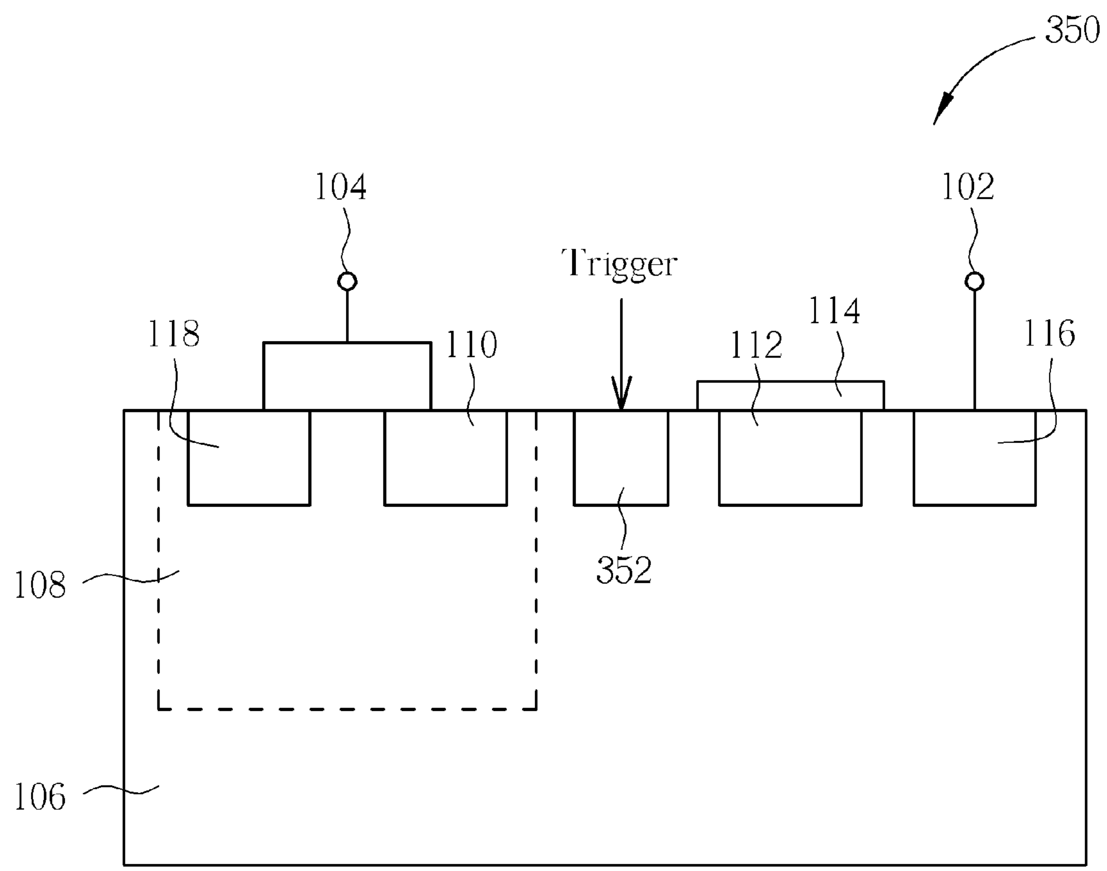
FIG. 9 is a schematic diagram illustrating a cross-sectional view of an ESD protection device according to a fifth preferred embodiment of the present invention.

Refer to FIG. 9, which is a schematic diagram illustrating a cross-sectional view of an ESD protection device according to a fifth preferred embodiment of the present invention. As shown in FIG. 9, as compared with the first preferred embodiment, the ESD protection device 350 of this embodiment further includes a seventh doped region 352. The seventh doped region 352 has P-type, and is disposed in the P-type substrate 106 between the P-type first doped region 110 and the N-type second doped region 112. The P-type seventh doped region 352 can be used as a trigger node to accept a trigger current. When current flows from the P-type seventh doped region 352 into the P-type substrate 106, the ESD protection device 350 can be triggered on into its latch-up state to provide a low impedance path to discharge ESD current from the second power node 104 to the first power node 102.

Figure 10:
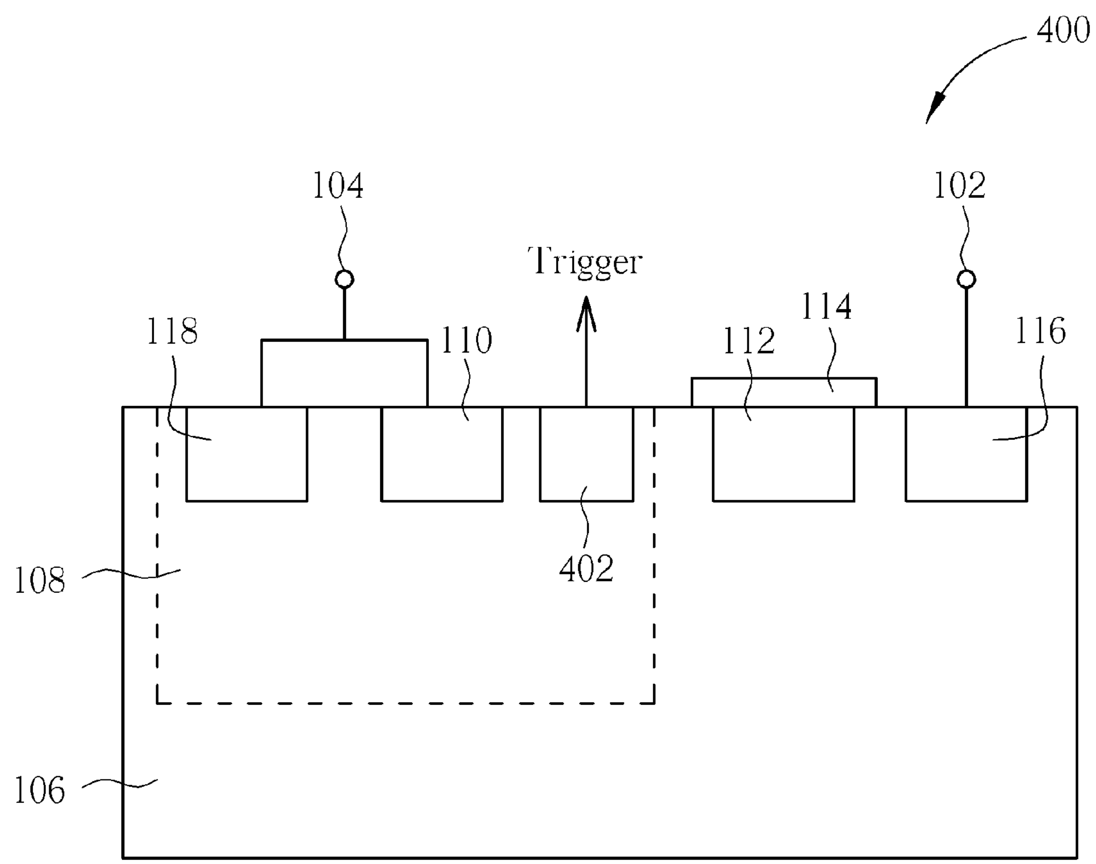
FIG. 10 is a schematic diagram illustrating a cross-sectional view of an ESD protection device according to a sixth preferred embodiment of the present invention.

Refer to FIG. 10, which is a schematic diagram illustrating a cross-sectional view of an ESD protection device according to a sixth preferred embodiment of the present invention. As shown in FIG. 10, as compared with the first preferred embodiment, the ESD protection device 400 of this embodiment further includes an eighth doped region 402. The eighth doped region 402 has N-type, and is disposed in the N-type well 108 between the P-type first doped region 110 and the N-type second doped region 112. The N-type eighth doped region 402 can be used as a trigger node to accept a trigger current. When current flows out from the N-type well 108 through the N-type eighth doped region 402, the ESD protection device 400 can be triggered on into its latch-up state to provide a low impedance path to discharge ESD current.

In summary, the present invention provides the ESD protection device having the N-type second doped region without being in contact with any conductive layer thereon to increase the holding voltage of the ESD protection device. Thus, the holding voltage of the ESD protection device can be adjusted to be larger than the voltage of the first power node. When the ESD protection device is triggered into the latch-up state by the noise leakage current during the normal operation, the holding voltage of the ESD protection device can be high enough to avoid being turned on, and the internal circuit can be protected.

Those skilled in the art will readily observe that numerous modifications and alterations of the device and method may be made while retaining the teachings of the invention.

What is claimed is:

1. An electrostatic discharge (ESD) protection device, comprising:

a substrate, having a first conductive type, and the substrate being electrically connected to a first power node;

a well, having a second conductive type and disposed in the substrate;

a first doped region, having the first conductive type and disposed in the well, and the first doped region and the well being electrically connected to a second power node; and a second doped region, having the second conductive type and disposed in the substrate; and the second doped region being in a floating state and being spaced apart from the well.

2. The ESD protection device according to claim 1, further comprising an insulating layer, covering the second doped region.

3. The ESD protection device according to claim 1, further comprising a third doped region, having the first conductive type and disposed in the substrate, and the substrate being electrically connected to the first power node through the third doped region.

4. The ESD protection device according to claim 3, wherein the second doped region is disposed between the first doped region and the third doped region.

5. The ESD protection device according to claim 1, further comprising a fourth doped region, having the second conductive type and disposed in the well, and the well being electrically connected to the second power node through the fourth doped region.

6. The ESD protection device according to claim 5, wherein the first doped region is disposed between the second doped region and the fourth doped region.

7. The ESD protection device according to claim 1, further comprising a fifth doped region, disposed across a junction between the substrate and the well.

8. The ESD protection device according to claim 7, further comprising a gate insulating layer disposed on the substrate between the fifth doped region and the second doped region, and a control gate disposed on the gate insulating layer and electrically connected to the first power node.

9. The ESD protection device according to claim 7 further comprising a sixth doped region, disposed in the substrate and in contact with the fifth doped region, wherein the fifth doped region has the second conductive type, and the sixth doped region has the first conductive type.

10. The ESD protection device according to claim 1, further comprising a seventh doped region, disposed in the substrate between the first doped region and the second doped region and used as a trigger node to accept a trigger current.

11. An ESD protection circuit, comprising:

a first BJT, having a first type and having a first base, a first emitter and a first collector, wherein the first emitter is electrically connected to the second power node;

a second BJT, having a second type different from the first type and having a second base, a second emitter and a second collector, wherein the second collector is electrically connected to the first base, and the second base is electrically connected to the first collector; and a diode, having an anode and a cathode, wherein the anode is electrically connected to the second emitter, and the cathode is electrically connected to the first power node.

12. The ESD protection circuit according to claim 11, further comprising a first resistor electrically connected between the first base and the second power node, and a second resistor electrically connected between the second base and the first power node.

* * * * *